United States Patent
Sandberg et al.

(10) Patent No.: US 9,536,019 B2
(45) Date of Patent: Jan. 3, 2017

(54) METHOD AND SYSTEM FOR SELECTING POSITION AND ORIENTATION FOR A MONITORING CAMERA

(71) Applicant: AXIS AB, Lund (SE)

(72) Inventors: Göran Sandberg, Lund (SE); Mohammad Reza Shams Amiri, Lund (SE); Sarmad Rohani, Lund (SE)

(73) Assignee: AXIS AB, Lund (SE)

( * ) Notice: Subject to any disclaimer, the term of this patent is extended or adjusted under 35 U.S.C. 154(b) by 326 days.

(21) Appl. No.: 14/450,443

(22) Filed: Aug. 4, 2014

(65) Prior Publication Data

US 2015/0046129 A1  Feb. 12, 2015

(30) Foreign Application Priority Data

Aug. 7, 2013 (EP) .................................... 13179569

(51) Int. Cl.
  *G06F 17/50* (2006.01)
  *G08B 13/196* (2006.01)
  *H04N 7/18* (2006.01)

(52) U.S. Cl.
  CPC ......... *G06F 17/50* (2013.01); *G08B 13/19641* (2013.01); *G08B 13/19645* (2013.01); *H04N 7/181* (2013.01); *G06F 17/5004* (2013.01); *G08B 13/19652* (2013.01)

(58) Field of Classification Search
  CPC ................... G08B 13/19641; G08B 13/19652; G08B 13/19645; G06F 17/5004
  See application file for complete search history.

(56) References Cited

U.S. PATENT DOCUMENTS

| | | | |
|---|---|---|---|
| 5,123,085 A | * | 6/1992 | Wells .................... G06T 15/503 345/421 |
| 2003/0058342 A1 | | 3/2003 | Trajkovic |
| 2007/0183669 A1 | * | 8/2007 | Owechko .......... G06K 9/00369 382/224 |
| 2008/0007720 A1 | | 1/2008 | Mittal |
| 2010/0110183 A1 | | 5/2010 | Bobbitt et al. |
| 2011/0317016 A1 | | 12/2011 | Saeki et al. |
| 2012/0038766 A1 | | 2/2012 | Park et al. |
| 2012/0069190 A1 | | 3/2012 | Nam et al. |
| 2012/0197600 A1 | | 8/2012 | Bai et al. |

(Continued)

OTHER PUBLICATIONS

PNPOLY—Point Inclusion in Polygon Test by W. Randolph Franklin (WRF), p. 1-9, 2006 https://www.ecse.rpi.edu/~wrf/Research/Short_Notes/pnpoly.html.*

(Continued)

*Primary Examiner* — Akash Saxena
(74) *Attorney, Agent, or Firm* — Volpe and Koenig, P.C.

(57) ABSTRACT

The present invention relates to the field of camera placement for monitoring an area, and in particular to the field of assisted camera placement in an area comprising a monitoring area. The present invention is based upon the realization that in many cases, the monitoring of a monitoring area needs to be performed with a required view angle of incidence in order to facilitate monitoring of the area. The present invention provides methods, systems and computer-readable recording mediums for selecting position and orientation for one or more monitoring cameras in an area, the area comprising at least a monitoring area.

19 Claims, 10 Drawing Sheets

(56) References Cited

U.S. PATENT DOCUMENTS

| | | | |
|---|---|---|---|
| 2012/0307067 A1 | 12/2012 | Chen et al. | |
| 2013/0135315 A1* | 5/2013 | Bares | G06T 13/20 345/473 |
| 2015/0046129 A1* | 2/2015 | Sandberg | G06F 17/50 703/1 |
| 2016/0188756 A1* | 6/2016 | Gonzalez-Banos | G06F 17/5004 703/1 |

OTHER PUBLICATIONS

Automated Camera Placement using Hybrid Particle Swarm Optimization; by Mohammad Reza Shams Amiri and Sarmad Rohani, Masters Thesis Mar. 2014, 137 pages.*

Optimizing Visual Sensor Parameters for Total Coverage Maximization; Altahir A. Altahir et al, IEEE 2014, 6 pages.*

Hit-testing From Wikipedia pp. 1-2, 2016.*

Akbarzadeh, Vahab et al., "Probabilistic Sensing Model for Sensor Placement Optimization Based on Line-of-Sight Coverage"; IEEE Transactions on Instrumentation and Measurement, vol. 62, No. 2, pp. 293-303 (Feb. 2013).

Bouyagoub, Samira et al., "Automatic Multi-Camera Placement and Optimization Using Ray Tracing"; Proceedings of 2010 IEEE 17th International Conference on Image Processing; ICIP 2010; pp. 681-684; Sep. 26-29, 2010, Hong Kong.

Conci, N. et al., "Camera Placement Using Particle Swarm Optimization in Visual Surveillance Applications"; 2009 16th IEEE International Conference on Image Processing (ICIP), Piscataway, NJ, US; XP031628497; ISBN: 978-1-4244-5653-6; pp. 3485-3488 (Nov. 7, 2009).

Erdem, U.M. et al. "Automated camera layout to satisfy task-specific and floor plan-specific coverage requirements"; Computer Vision and Image Understanding; vol. 103, No. 3; pp. 156-169 (Sep. 1, 2006).

Gupta, Ankit et al. "A NSGA-II Based Approach for Camera Placement Problem in Large Scale Surveillance Application"; 2012 4th International Conference on Intelligent and Advanced Systems (ICIAS); XP032238662; ISBN: 978-1-4577-1968-4; pp. 347-352 (Jun. 12, 2012).

Kennedy, James et al. "Particle Swarm Optimization"; Proceedings IEEE International Conference in Neural Networks, vol. 4, pp. 1942-1948 (1995).

Morsly, Yacine et al. "On the Best Interceptor Placement for an Optimally Deployed Visual Sensor Network"; 2010 IEEE International Conference on Systems Man and Cybernetics (SMC), Piscataway, NJ, US, XP031806047, ISBN: 978-1-4244-6586-6; pp. 43-51 (Oct. 10, 2010).

Reddy, Krishna Konda et al. Camera positioning for global and local coverage optimization; 2012 IEEE Sixth International Conference on Distributed Smart Cameras (ICDSC), XP032336156, ISBN: 978-1-4503-1772-6; 6 pages (Oct. 30, 2012).

Xu, Yichun et al. "Three Particle Swarm Algorithms to Improve Coverage of Camera Networks with Mobile Nodes"; 2010 IEEE Fifth International Conference on Bio-Inspired Computing: Theories and Applications (BIC-TA), Piscataway, NJ, US, XP031808135, ISBN: 978-1-4244-6437-1; pp. 816-821 (Sep. 23, 2010).

Xu, Yi-Chun et al. "Camera Network Coverage Improving by Particle Swarm Optimization"; EURASIP Journal on Image and Video Processing; vol. 6, No. 1, Article ID 458283; XP055095325; ISSN: 1687-5176; DOI: 10.1016/j.biosystems.2006.12.007; 10 pages; Hindawi Publishing Corporation (Jan. 1, 2011).

Zhou, Pu et al. "Optimal Coverage of Camera Networks Using PSO Algorithm"; 2011 4th International Congress on Image and Signal Processing (CISP); XP032071091; ISBN: 978-1-4244-9304-3; DOI: 10.1109/CISP.2011.6100649; pp. 2084-2088 (Oct. 15, 2011).

Only Abstract Is Considered, Not the Entire Document Because It Is Not in English. Cho, Youngseok et al. "A Study on Tracking Algorithm for Moving Object Using Partial Boundary Line Information"; The KIPS Transactions: PartB: Korea Information Processing Society; vol. 8B, Issue 5; pp. 539-548 (2001).

* cited by examiner

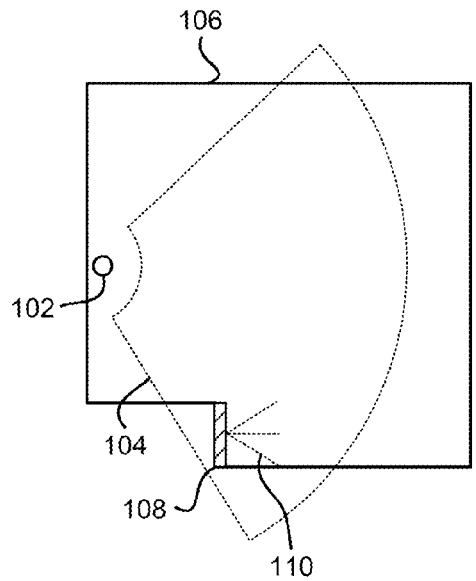
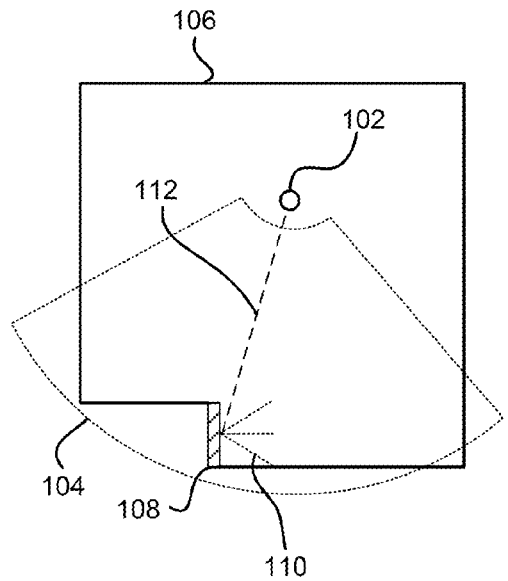
FIG. 1A  FIG. 1B
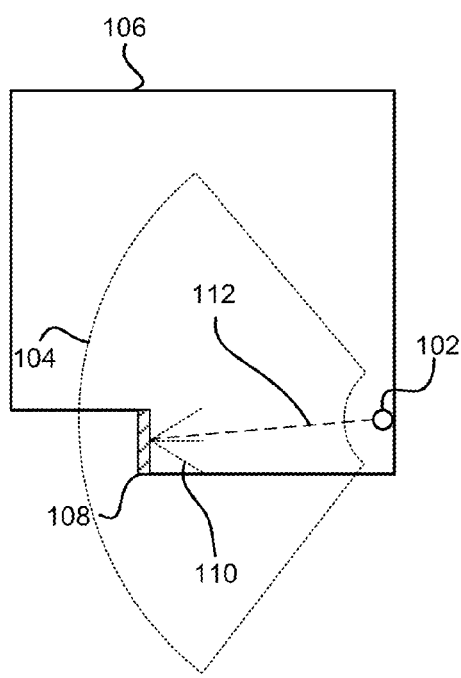
FIG. 1C

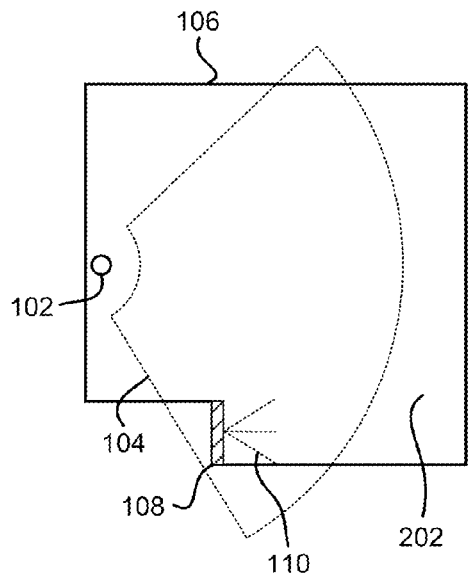
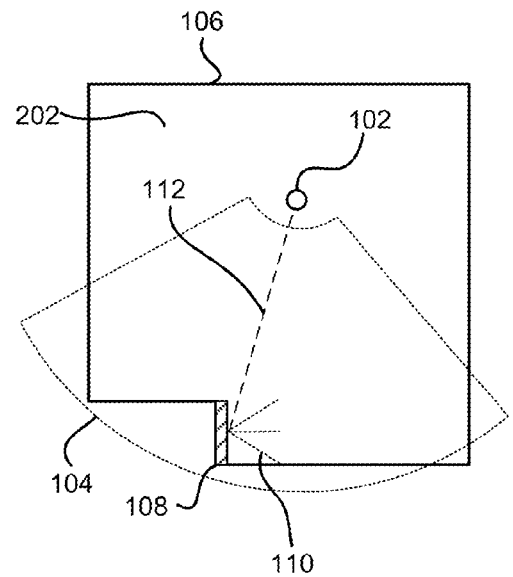
FIG. 2A    FIG. 2B
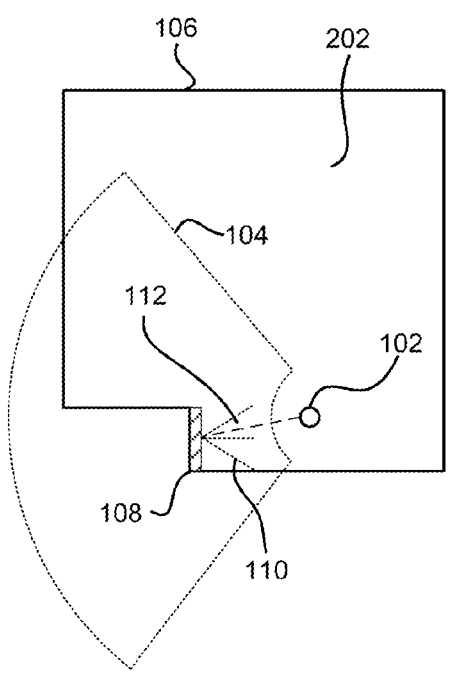
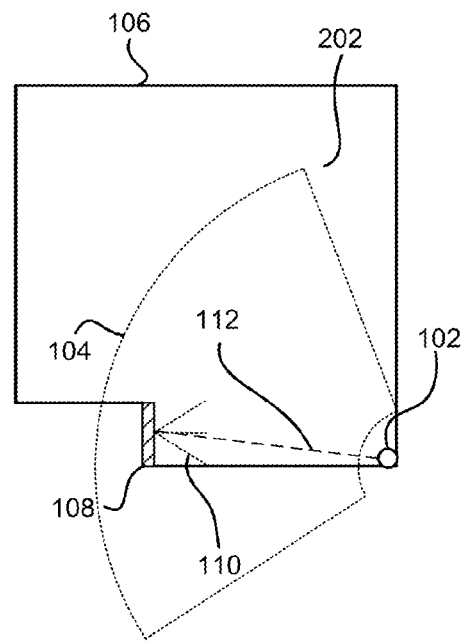
FIG. 2C    FIG. 2D

METHOD AND SYSTEM FOR SELECTING POSITION AND ORIENTATION FOR A MONITORING CAMERA

CROSS REFERENCE TO RELATED APPLICATION

This application claims priority to European Patent Application No. 13179569.2, filed Aug. 7, 2013, which is incorporated by reference as if fully set forth.

FIELD OF INVENTION

The present invention relates to the field of camera placement for monitoring an area, and in particular to the field of assisted camera placement in an area comprising a monitoring area.

BACKGROUND

Video monitoring of an area has been much used for years, for example by the surveillance industry. When setting up one or more video cameras in an area for monitoring the area, the best set up of the cameras considering the configuration of the area, for example obstacles in the area like a pillar or a wall, may be hard to achieve. In many cases a trained person needs to use hers/his expert knowledge for setting up the monitoring system.

US 2012/0307067 (Chen et al.) relates to a system and a method for automatic camera placement. The method disclosed in this document comprises dividing the area into for example a surveillance area, a non-surveillance area, a blank area and/or an obstacle. The method further comprises selecting and altering for example the number of cameras, the location or orientation of the cameras and/or the model of the cameras and then use a fitness function for choosing the number of cameras, the location or orientation of the cameras and/or the model of the cameras. The method disclosed in US 2012/0307067 may help when choosing a camera set up, but further features and constraints needs to be considered when setting up a video monitoring system.

SUMMARY

In view of the above, an objective of the invention is to provide an improved method, system and computer-readable recording medium for selecting position and orientation for one or more monitoring cameras in an area, wherein the area comprises at least a monitoring area. Generally, the above objective is achieved by the attached independent patent claims.

According to a first aspect, the present invention is realized by a method for selecting position and orientation for one or more monitoring cameras in an area, the area comprising at least a monitoring area, the method comprising the steps of: receiving, by a processor, data regarding the area; modeling, by the processor, a virtual area with use of the data; evaluating, by the processor, iterations of a fitness function, the fitness function comprising: position and orientation of the one or more monitoring cameras within the virtual area for calculating a simulated coverage area for the one or more monitoring cameras and for calculating a simulated view angle of incidence for the monitoring area; selecting, by the processor, a fitted solution to the fitness function, the fitted solution comprising the position and orientation of the one or more monitoring cameras, wherein the selecting is based on the calculated simulated coverage area for the one or more monitoring cameras, the calculated simulated view angle of incidence for the monitoring area and a required view angle of incidence for the monitoring area.

The present invention is based upon the realization that in many cases, the monitoring of a monitoring area needs to be performed with a required view angle of incidence in order to facilitate monitoring of the area. For example, when monitoring people entering an area through a doorway, the camera is advantageously positioned in front of the doorway, and directed towards a position in the doorway at a height of an average human, to facilitate, for example facial recognition of the person entering the area. When monitoring an assembly line, the camera is advantageously positioned such that the product is monitored in an angle where most parts of the product are visible, and the like.

According to an embodiment, at least one of the position and orientation of at least one of the one or more monitoring cameras within the virtual area are altered in each iteration and wherein iterations of the fitness function are evaluated until the fitted solution comprises a simulated coverage area completely covering the monitoring area, and the fitted solution fulfilling the required view angle of incidence for the monitoring area.

This embodiment further facilitates monitoring of the monitoring area, since the entire monitoring area will be monitored. There may of course exist occasions where the monitoring cameras cannot monitor the entire monitoring area. For those cases, a max number of iterations may be configured. When the fitness function reaches the max number of iterations, the best fitted solution is chosen, for example the solution where the simulated coverage area is almost covering the monitoring area but where the required view angle of incidence is achieved. It may be noted that the iterations of the fitness function may proceed even if a fitted solution is found comprising a simulated coverage area completely covering the monitoring area, and the required view angle of incidence for the monitoring area.

According to a further embodiment, the step of selecting a fitted solution is further based on a required resolution for an image captured by at least one of the one or more monitoring cameras monitoring the monitoring area. This may further facilitate monitoring of the monitoring area, since a high resolution image contains more details than a low resolution image.

According to embodiments, the area further comprises a blank area, and wherein the step of selecting a fitted solution is further based on a percentage of the blank area being monitored.

By the term "blank area" should, in the context of the present specification, be understood a part of the area where monitoring is neither required, i.e. a monitoring area, nor forbidden.

Even if the area comprises monitoring areas where monitoring may be most important, monitoring other parts of the area may be advantageous. By selecting the fitted solution further based on the percentage of the blank area being monitored, the method can choose between a plurality of solutions where the requirement of monitoring the entire monitoring area with a required view angle of incidence are fulfilled. In those cases, the selected fitted solution may be the one where the largest part of the blank area is being monitored.

The area may further comprise a none-monitoring area. According to this embodiment, the step of selecting a fitted solution may further be based on that the none-monitoring area is not monitored by the at least one or more monitoring cameras.

By the term "none-monitoring area" should, in the context of the present specification, be understood an area which should not be monitored. By way of example, such an area may comprise an employees' working space, or more private areas such as parts of a bathroom or a resting area.

An advantage of this embodiment may be that the method handles an area where some parts of the area is to be kept unmonitored.

According to some embodiments, the fitness function comprises a number of monitoring cameras and wherein the fitted solution further comprises the number of monitoring cameras. Due to economy or other reasons, more or less cameras may be available for monitoring the area.

According to some embodiments, at least one of the number of monitoring cameras within the virtual area and the position and the orientation of at least one of the one or more monitoring cameras within the virtual area, are altered in each iteration. This may make the fitness function more flexible, since the number of cameras may be changed which in turn may increase the possibility to find a fitted solution according to the requirements.

According to some embodiments, each of the at least one monitoring cameras comprises camera features, the camera features comprising at least one of a field of view and a zoom level, and wherein the fitted solution comprises the camera features of the at least one monitoring cameras. In this case, at least one of the camera features of the at least one monitoring camera within the virtual area and the position and the orientation of at least one of the one or more monitoring cameras within the virtual area, may be altered in each iteration. Due to for example economy, a cheaper camera with a smaller field of view and that cannot zoom may have to be used for monitoring. The level of zoom may impact on for example the field of view of the camera but also the resolution of an image captured by the camera. By being able to alter the camera features of the monitoring cameras, i.e. changing camera model or the zoom level of a camera, when iterating the fitness function, a more flexible method is achieved.

In some embodiments, the fitness function further comprises at least two monitoring cameras and the step of selecting a fitted solution is further based on a required viewing angle for the monitoring area for each of the at least two monitoring cameras. There may be a requirement of the monitoring system that an area is monitored from for example two directions. For example, when monitoring an goal area in a soccer field, two cameras monitoring the goal area from different angles may be needed for being totally sure if a ball is entirely within the goal area or not, i.e. by using triangulation techniques. It may be noted that the monitoring area may comprise more than one separated monitoring area and that each of the at least two monitoring cameras in this case does not have to monitor the same separated monitoring area. The different required viewing angles may thus pertain to different separated monitoring areas.

According to some embodiments, the simulated coverage area is calculated using an active edge algorithm. The common alternative is to use a sampled representation of the virtual area, i.e. by dividing the virtual area into a grid, and for each cell in the grid calculate if the grid is covered or not. An advantage of using the active edge algorithm is that a continuous coverage area is achieved and thus a more accurate simulated coverage area. A further advantage is that the time complexity of the algorithm is O(n), i.e. a linear time algorithm. This means that the fitness function may be performed faster than if a slower algorithm is used.

According to some embodiments, the alteration in each iteration are performed by a particle swarm optimization (PSO) algorithm. This is an advantageous algorithm when using more than one camera since each alteration for a specific camera is influenced by both its local best known solution and the overall best known solution, i.e. considering all cameras.

It may be noted that any suitable optimization algorithm for optimizing the solution (i.e. the fitted solution) to the fitness function considering the input data to the fitness function can be used. Other examples of a suitable optimizing algorithm may be search heuristics optimization approaches such as evolutionary algorithms. A further example may be gradient methods or using programming approaches such as dynamic programming or Integer Linear Programming (ILP).

In a second aspect, the present invention provides a computer-readable recording medium having recorded thereon a program for implementing the method according to the first aspect when executed on a device having processing capabilities.

In a third aspect, the present invention provides a system for selecting position and orientation for one or more monitoring cameras in an area, the area comprising at least a monitoring area, the system comprising: one or more computer processors configure to: receive data regarding the area; model a virtual area with use of the data; evaluate iterations of a fitness function for calculating a fitted solution, the fitness function comprising: a required viewing angle for the monitoring area, and position and orientation of the one or more monitoring cameras within the virtual area for calculating a simulated coverage area for the one or more monitoring cameras and for calculating a simulated view angle of incidence for the monitoring area; select a fitted solution to the fitness function, the fitted solution comprising the position and orientation of the one or more monitoring cameras, wherein the selection is based on the calculated simulated coverage area for the one or more monitoring cameras, the calculated a simulated view angle of incidence for the monitoring area and a required view angle of incidence for the monitoring area.

The second and third aspect may generally have the same features and advantages as the first aspect.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above disclosed and other aspects of the present invention will now be described in more detail, with reference to the appended drawings showing embodiments of the invention, in which:

FIGS. 1A-C show a method for selecting position and orientation for a monitoring camera according to embodiments;

FIGS. 2A-D show a method for selecting position and orientation for a monitoring camera according to embodiments;

DETAILED DESCRIPTION OF THE PREFERRED EMBODIMENTS

Figure 3A:
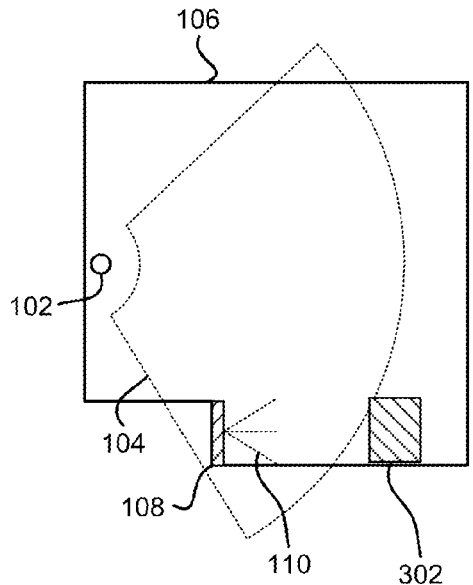
FIGS. 3A-D show a method for selecting position and orientation for a monitoring camera according to embodiments.

Embodiments of the present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Furthermore, like numbers refer to like elements throughout.

By the term "fitness function" should, in the context of present specification, be understood a function for calculating a measure of how optimal the current solution (i.e. the fitted solution) is.

By the term "orientation" should, in the context of the present specification, be understood the combination of a pan and a tilt angle of the camera or just the pan angle or the tilt angle of the camera. Pan is the angle which camera is rotated in a horizontal plane and tilt is the angle that camera rotates in a vertical plane.

By the term "monitoring area" should, in the context of the present specification, be understood a sub area of the area (or in some cases the entire area) which needs to be monitored by at least one camera. An example of such an area may be a famous painting at a museum, an entrance to a bank valve or the product safety evaluation area in an assembly line. The monitoring area may comprise one continuous area or several separated areas.

By the term "view angle of incidence" should, in the context of the present specification, be understood the angle of which the area or an object in the area or a part of the area is being monitored by a camera. The angle may be expressed in one, two or three dimensions. The required view angle of incidence may specify a range of angles, or a maximum angle or a minimum angle.

By the term "virtual area" should, in the context of the present specification, be understood any suitable computer representation of the area. A polygon representation is the most common, but a vector representation, for example by using isosurfaces representing surfaces in the area, is equally possible. According to further embodiments, discrete point-based representations such as level sets are employed.

By the term "coverage area" should, in the context of the present specification, be understood the region of the area that the at least one camera would monitor placed in that position.

By the term "blank area" should, in the context of the present specification, be understood a part of the area where monitoring is neither required, i.e. a monitoring area, nor forbidden.

By the term "none-monitoring area" should, in the context of the present specification, be understood an area which should not be monitored. By way of example, such an area may comprise an employees' working space, or more private areas such as parts of a bathroom or a resting area.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

It may be noted that for ease of example and clarity, each of the FIGS. 1-8 describes a two dimensional representation, or 2D projection, of a three dimensional scene.

Figure 6:
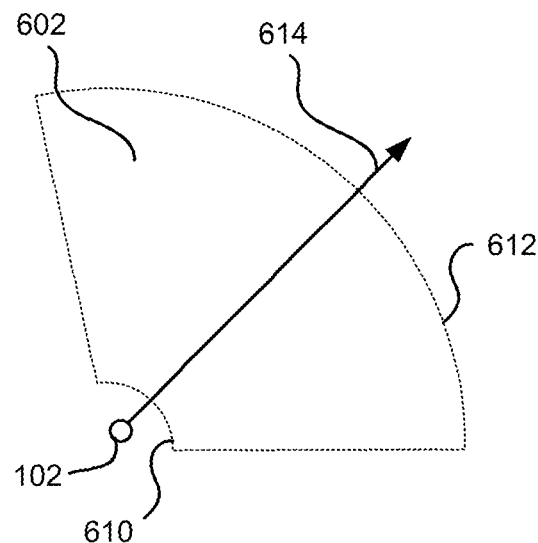
FIG. 6 illustrates the parameters of an optical camera.

FIG. 6 shows by way of example parameters of an optical camera 102. The field of view (FoV) 602 of the camera 102 is an intrinsic parameter which indicates the part of the scene, (volume, for example a cone), that is visible through camera's lens and is measured in degrees. FoV actually represents the area which could be monitored by the camera.

The distance between the nearest and the farthest objects that would appear acceptably sharp in the image provided by camera is called depth of field (DoF). This is illustrated in FIG. 6, by the nearest edge 610, also called the nearest depth (ND) and the farthest edge 612, also called the farthest depth (FD), of the FoV cone 602 (shown in cross section in FIG. 6).

The spatial resolution (SR) of a camera is the ratio between total number of pixels of the object on the image and the object's size. A given spatial resolution requirement results from the distance between the object and the camera. The spatial resolution of a camera can be converted into the FD. A higher SR requirement may result in the camera having a shorter FD.

Each camera is defined by a set of parameters, and there are many types of cameras available. Each different camera has a different lens type, element type, etc. Normally, three types of cameras are a fixed perspective camera, a pan-tilt-zoom (PTZ) camera, and an omnidirectional camera. A fixed perspective camera, once mounted in place, has a fixed position, orientation 614, and focal length. A fixed perspective camera may have a small DoF and FoV because of its fixed focal length, i.e. it cannot zoom. A PTZ camera can be rotated and has an adjustable focal length (zoom). Consequently, a PTZ camera may have a larger DoF and FoV than a fixed perspective camera. An omnidirectional camera has a $2\pi$ FoV. For a PTZ camera, because of its ability to rotate, a bisector 614 of the rotated angle is its orientation. In the case of an omnidirectional camera, the orientation is not an issue since it has $2\pi$ FoV.

Figure 7:
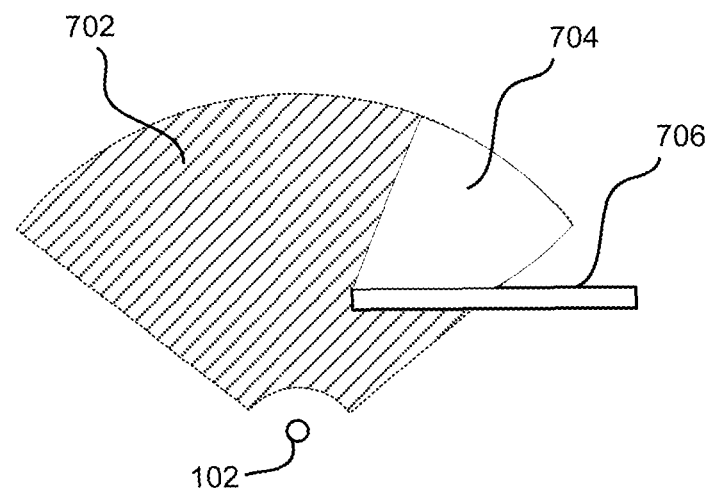
FIG. 7 shows example of an coverage area of an optical camera.

In this description, the coverage area refers to the region that the camera can monitor and is not occluded by obstacles. This is shown by way of example in FIG. 7. In FIG. 7, an obstacle 706 is blocking parts of the FoV of the camera 102. The effect is that not the entire FoV can be utilized for monitoring. In this example, the area 702 is monitored, i.e. the coverage area of the camera 102. However, the area 704 occluded by the obstacle 706 remains unmonitored.

Figure 5:
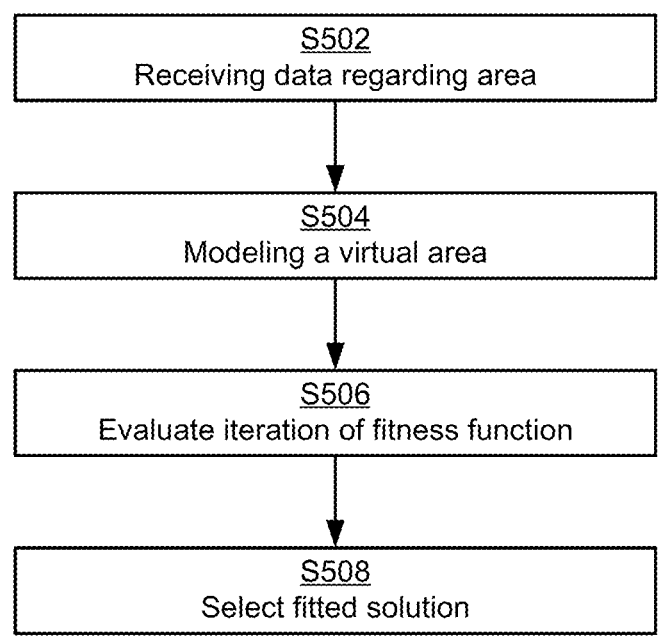
FIG. 5 shows a flow chart of a method for selecting position and orientation for one or more monitoring cameras in an area.

FIGS. 1A-C describe by way of example a method, partly described in FIG. 5, for selecting position and orientation for a monitoring camera 102. FIG. 1A shows an area 106 to be monitored. The area comprises a monitoring area 108, for example a door.

Data regarding the area 106 to be monitored is received S502 by a processor and modelled S504 into a virtual area. In this example, as well as in the examples described in conjunction with FIGS. 2A-D, 3A-D, 4A-C and 8A-D, the figures shows iterations of a fitness function for selecting S508 the position and orientation for the one or more monitoring cameras. In each iteration of the fitness function, at least one of the position and orientation of at least one of the one or more monitoring cameras within the virtual area are altered. It may be noted that the iterations is described, in conjunction with the figures, as really taking place within the area 106, but the skilled person understands that this is just for ease of example and clarity.

As seen in FIG. 1A, not the entire FoV 104 of the camera 102 can be utilized for monitoring the area 106, more specifically the monitoring area 108, since the wall close to the monitoring area 108 is blocking parts of the FoV 104 of the camera 102. Consequently, a simulated coverage area of the camera 102 within the virtual area is not covering the monitoring area 108. The evaluation S506, performed by the processor, of this iteration of the fitness function may thus result in that a new iteration of the fitness function needs to take place. In FIG. 1b, both the position and orientation of the camera 102 has been altered. With this new position and orientation, nothing is blocking the FoV 104 of camera 102 from monitoring the monitoring area 108, i.e. the monitoring area 108 is within the cameras coverage area. However, a simulated view angle of incidence 112 for the monitoring area 108 is not within a required range of view angle of incidence 110. The evaluation S506, performed by the processor, of this iteration of the fitness function may thus result in that a new iteration of the fitness function needs to take place. In FIG. 1C, both the position and orientation of the camera 102 has been altered once more. Now the camera 102 is positioned substantially in front of the monitoring area 108 and oriented towards it. The simulated view angle of incidence 112 for the monitoring area 108 now is within the required range of view angle of incidence 110. Furthermore, the simulated coverage area is completely covering the monitoring area 108. The processor may thus select S508 this position and orientation of the camera 102 as the fitted solution to the fitness function.

FIGS. 2A-D describe by way of example a method, partly described in FIG. 5, for selecting position and orientation for the monitoring camera 102. FIG. 2A shows the area 106 to be monitored. The area comprises the monitoring area 108 and a blank area 202. FIGS. 2A-B describe the same thing as already described in conjunction with FIGS. 1A-B, i.e. that two iterations are performed and that the evaluation S506 of the iterations results in that further iterations are needed. In FIG. 2C, the simulated view angle of incidence 112 for the monitoring area 108 now is within the required range of view angle of incidence 110. Furthermore, the simulated coverage area is completely covering the monitoring area 108. However, since the monitoring area comprises the blank area 202, the processor may be configured to continue evaluate S506 iterations of the fitness function to see if a fitted solution wherein a larger part of the blank area 202 can be monitored compared to how large part is monitored in already found fitted solutions. As can be seen in FIG. 2D, by moving the camera 102 down to the bottom right corner of the area 106 and orient it slightly to the right, from the cameras 102 perspective, a larger part of the blank area 202 is monitored compared to the part of the blank area 202 monitored in FIG. 2C. Consequently, the processor may select S508 the cameras' position and orientation in the iteration shown in FIG. 2D as the fitted solution.

Figure 3B:
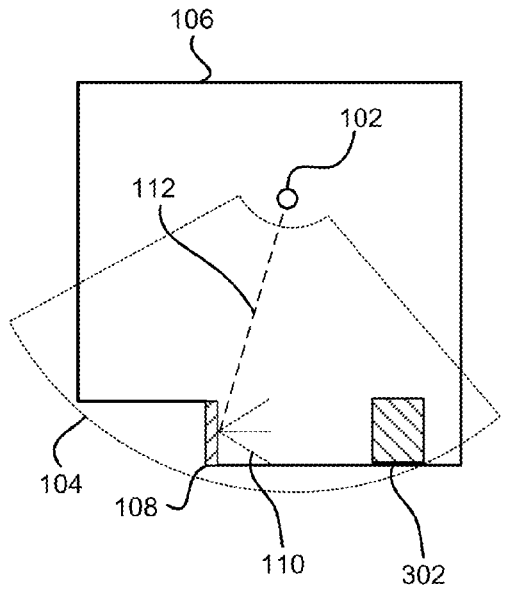
Figure 3C:
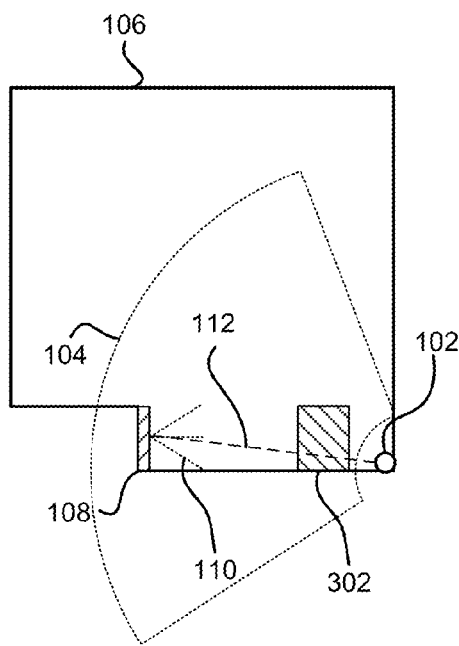
Figure 3D:
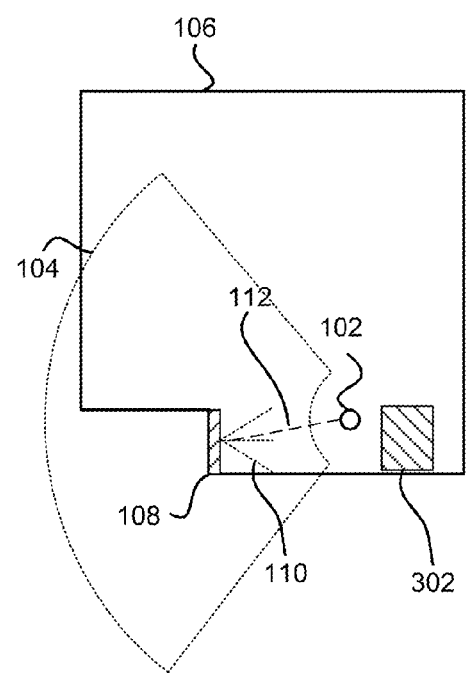

FIGS. 3A-D describe by way of example a method, partly described in FIG. 5, for selecting position and orientation for the monitoring camera 102. FIG. 3A shows the area 106 to be monitored. The area comprises the monitoring area 108, for example a door, and a none-monitoring area 302. The none-monitoring area 302 may for example be the working area of an employee guarding the door 108. FIGS. 3A-B describe the same thing as already described in conjunction with FIGS. 1A-B, i.e. that two iterations is performed and that the evaluation S506 of the iterations results in that further iterations are needed. Moreover, FIG. 3B shows that the coverage area of the camera 102 covers the none-monitoring area 302 which may not be allowed in some embodiments of the evaluations process implemented in the processor. According to some embodiment, no part of the none-monitoring area is allowed to be monitored by the camera 102. In other embodiments, the none-monitoring area can be monitored by the camera with a specified view angle of incidence. For example, if the none-monitoring area comprises a PC, it may be allowable to monitor the none-monitoring area from behind the PC, i.e. so the screen of the PC is not monitored. In the embodiment described in conjunction with FIGS. 3A-D, no part of the none-monitoring area is allowed to be monitored. As can be seen in FIG. 3C, the position and orientation of the camera 102 has been altered once more. Now the camera 102 is positioned such that the simulated view angle of incidence 112 for the monitoring area 108 is within the required range of view angle of incidence 110. Furthermore, the simulated coverage area is completely covering the monitoring area 108. However, the none-monitoring area 302 is still covered by the coverage area of the camera 102. Consequently, the evaluation S506 of the iteration results in that further iterations are needed. In FIG. 3D, the position and orientation of the camera 102 has been altered such that the camera 102 is positioned between the monitoring area 108 and the none-monitoring area 302. The camera 102 is oriented towards the monitoring area such that the simulated view angle of incidence 112 for the monitoring area 108 is within the required range of view angle of incidence 110 and that the simulated coverage area is completely covering the monitoring area 108. Now, the none-monitoring area 302 is completely outside the coverage area of the camera 102. Consequently, the processor may select S508 the cameras' position and orientation in the iteration shown in FIG. 3D as the fitted solution.

Figure 4A:
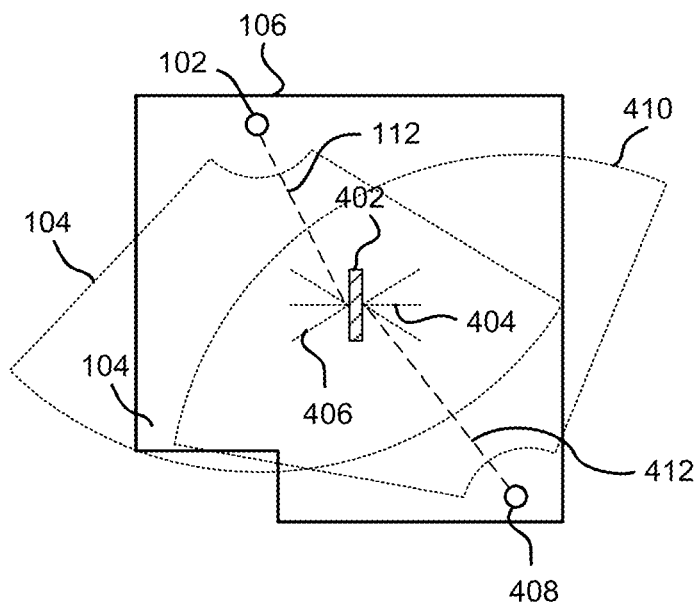
FIGS. 4A-C show a method for selecting position and orientation for two monitoring cameras according to embodiments.
Figure 4B:
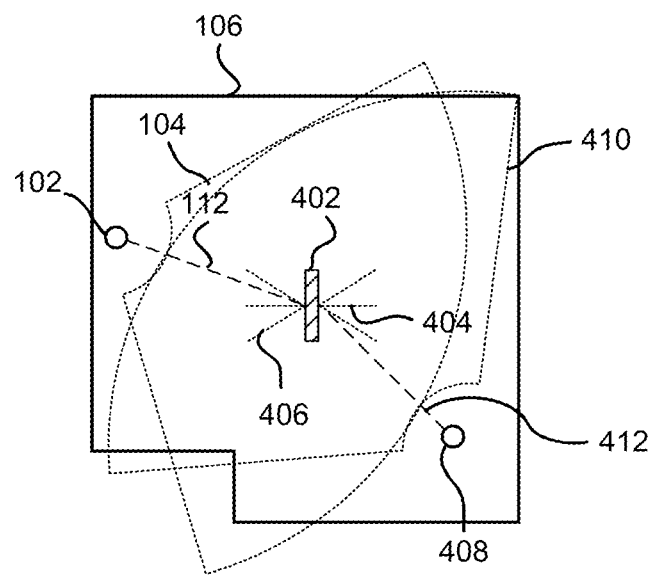
Figure 4C:
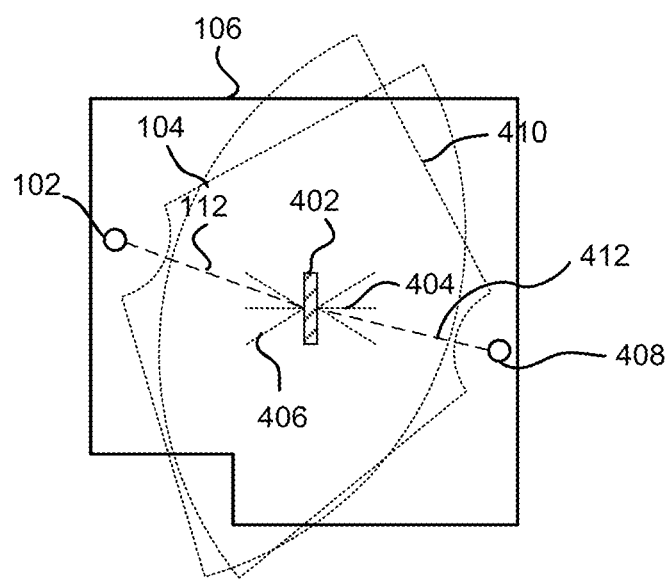

FIGS. 4A-C describe by way of example a method, partly described in FIG. 5, for selecting position and orientation for two monitoring cameras 102, 408. The area 106 comprises a monitoring area 402, which should be monitored from two directions, i.e. it has two required view angle of incidence 404, 406. In other words, the selection S508 of the fitted solution is based on the required view angle of incidence 404, 406 for the monitoring area 402 for each of the two monitoring cameras 102, 408. FIG. 4A illustrates that the simulated view angle of incidence 112, 412 for the monitoring area 402 is not within the required view angle of incidence 404, 406 for any of the two cameras 102, 408. In the next iteration, shown in FIG. 4B, the left camera 102 is positioned and oriented such that the simulated view angle of incidence 112 for the monitoring area 402 is within one of the required range of view angle of incidence 406 and that the simulated coverage area is completely covering the monitoring area 108. However, the right camera 408 still has a simulated view angle of incidence 412 which is not according to the requirements. Consequently, the evaluation S506 of the iteration results in that further iterations are needed. In the next iteration, shown in FIG. 4C, the position and orientation of left camera 102 is kept whilst the right camera 408 is moved and oriented differently compared to previous iteration shown in FIG. 4B. Now, the requirement of the two view angle of incidence 404, 406 is met. Consequently, the processor may select S508 the two cameras' 102 408 position and orientation in the iteration shown in FIG. 4C as the fitted solution.

It may be noted that in some cases, a certain point or area needs to be monitored from at least three different angles, i.e. with at least three different required view angle of incidence. The skilled person understands that the above description is easily adapted to handle these cases and this will not be described more in detail herein.

Figure 8A:
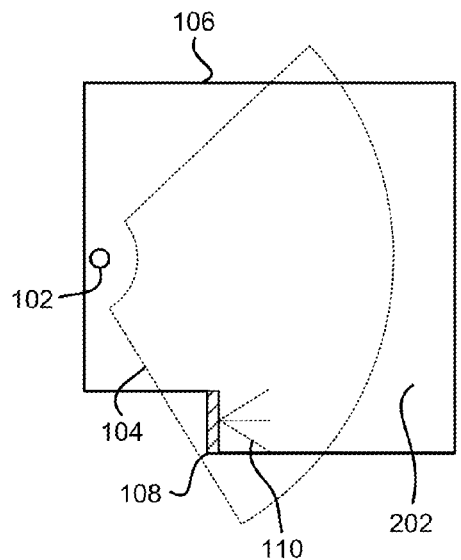
FIGS. 8A-D show a method for selecting position and orientation for two monitoring cameras according to embodiments.
Figure 8B:
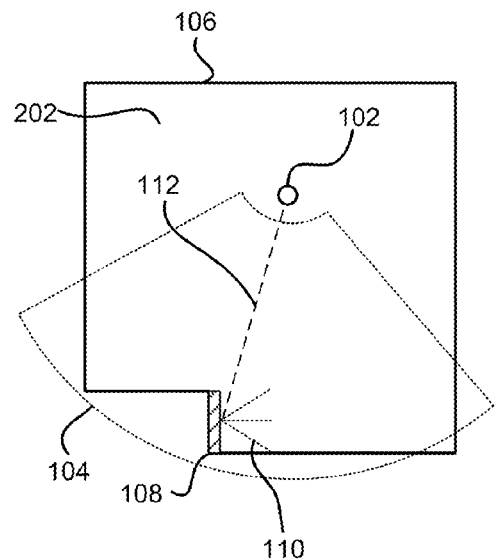
Figure 8C:
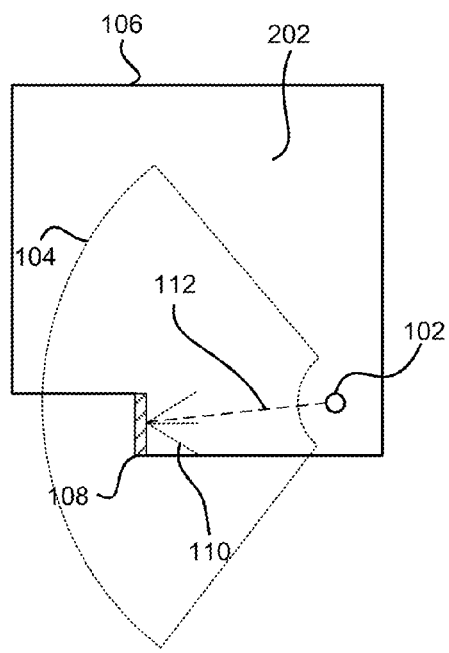
Figure 8D:
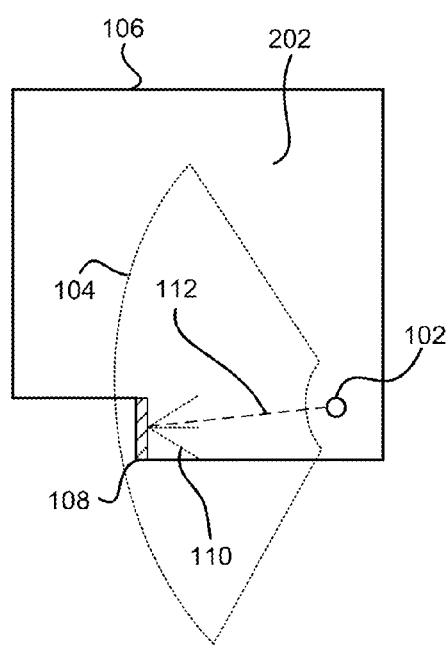

According to some embodiments, not only the position and/or orientation can be changed in each iteration of the fitness function. As described above, each camera may have camera features, such as field of view and zooming functionality. In the case the zooming functionality exists for a camera, zooming level exist as a feature. The settings of these features may be altered while iterating the fitness function. For example, if a resolution for an image captured by a monitoring camera monitoring the monitoring area may not be enough. In this case the zoom level may be changed such that the required resolution is achieved. This is illustrated in FIGS. 8A-D. FIGS. 8A-B describe the same thing as already described in conjunction with FIGS. 1A-B, i.e. that two iterations is performed and that the evaluation S506 of the iterations results in that further iterations are needed. In FIG. 8C, the simulated view angle of incidence 112 for the monitoring area 108 is within the required range of view angle of incidence 110. Furthermore, the simulated coverage area is completely covering the monitoring area 108. However, the resolution for the image captured by the monitoring camera 102 is not according to the requirements. A further iteration may thus be needed. In FIG. 8D, the FD of the camera 102 is reduced such that the required resolution of the monitoring area 108 is achieved. Consequently, the processor may select S508 the cameras' 102 position and orientation and zoom level in the iteration shown in FIG. 8D as the fitted solution.

Figure 11:
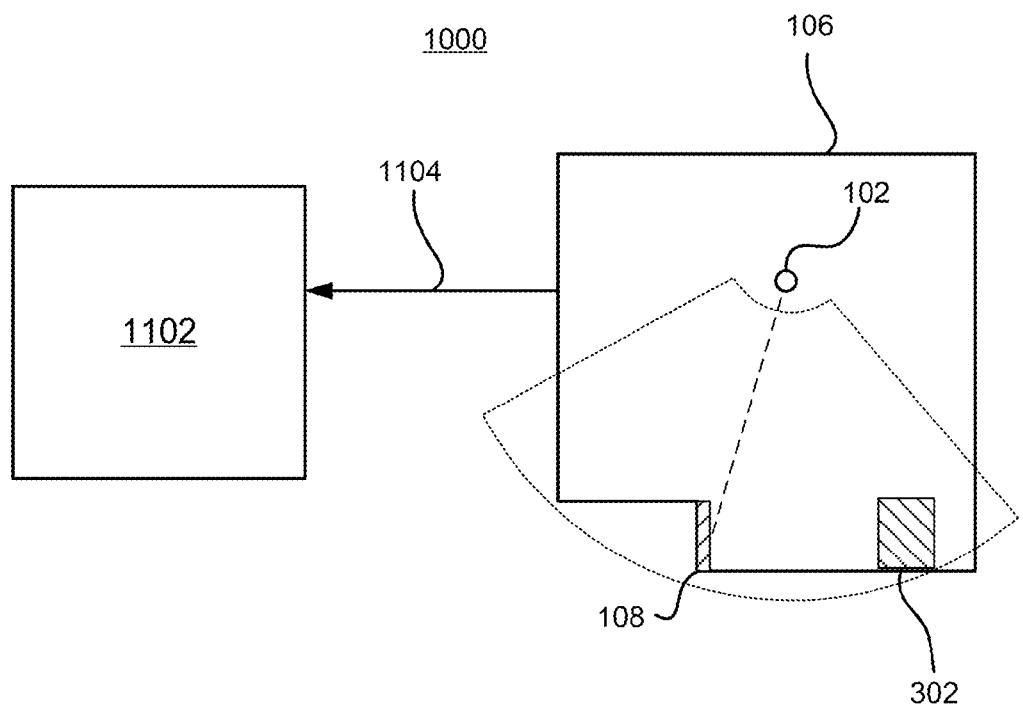
FIG. 11 describes a system for selecting position and orientation for one or more monitoring cameras in an area.

FIG. 11 describes a system 1000 for selecting position and orientation for one or more monitoring cameras 102 in an area 106, the area 106 comprising at least a monitoring area 108 and a non-monitoring area 302. The system 1000 comprises one or more computer processors 1102. The one or more computer processors 1102 are configured to receive data 1104 regarding the area 106, and further to model a virtual area with use of the data 1104. The one or more computer processors 1102 are further configured to evaluate iterations of a fitness function for calculating a fitted solution and for selecting a fitted solution to the fitness function as described herein above.

The simulated coverage area described above may be calculated using an active edge algorithm. The active edge algorithm is described in detail in *Automated camera layout to satisfy task-specific and floor plan-specific coverage requirements* (Erdem et al., 2006, *Computer Vision and Image Understanding*, 103(3): 156-169), which is incorporated herein by reference in its entirety.

The iteration approach may be implemented using a particle swarm optimization, PSO, algorithm. Swarm intelligence (SI) inspired optimization techniques have become largely popular in the last decade. Inspired from collective behavior of social insects (such as ants, bees, and wasps as well as animal societies such as flocks of birds or schools of fish), SI disciplines try to design an intelligent system by mimicking such behavior of these societies. Although single individuals of these colonies are non-sophisticated, complex tasks could be achieved in the shadow of cooperation and interactions between individual members in a decentralized and self-organized manner.

In scientific and industrial world, optimization problems are of high importance. An important class of optimization problems, known as combinatorial optimization (CO), deals with finding an optimal object from a finite set of objects (like traveling salesman problem, vehicle routing, minimum spanning tree, etc.). The algorithms which have been developed to solve CO problems could be classified as complete or approximate algorithms. Complete algorithms guarantee to find every instance of a CO problem and evaluate it to find an optimal solution. Albeit, for problems which are NP-hard, no polynomial time algorithm might exist, which leads us to use approximate methods. In approximate methods, the guarantee of finding the optimal solution is sacrificed for getting good enough solutions in a significantly reduced amount of time. The use of approximate methods have gained attention of a lot of researchers in recent years, due to the fact that they are easier to be implemented than classical gradient-based approaches and they do not require gradient information (especially when the objective function is implicitly given or when it is not differentiable). Particle Swarm Optimization is one of the most notable SI techniques for finding approximate solutions to NP-hard CO problems and is the focus of this study that will be discussed further.

Kennedy and Eberhart (*Particle swarm optimization. In Neural Networks*, 1995. *Proceedings., IEEE International Conference on*, volume 4, pages 1942-1948 vol. 4.), which is herein incorporated by reference, introduced Particle Swarm Optimization for the first time as a new optimization method for continuous nonlinear functions, which has its roots in two main component methodologies: artificial life in general and bird flocking, fish schooling, and swarm theory in particular. PSO concept was originated by simulation of a simplified social system, flocking birds and schooling fish, when searching for food. Assuming each bird as a particle, individual particles move towards a position based on their current velocity, their own previous experience, and the best previous experience of the group that was known so far. PSO follows adaptive culture model in which given a large space of possibilities the population is able to find multivariate solutions, patterns that solve problems, through a stripped-down form of social interaction. The simple sociocognitive theory which underlies PSO is based on three principles: evaluate (the tendency to evaluate stimuli, learning cannot occur if the organism cannot evaluate or distinguish features of environment which attracts or repels), compare (individuals compare themselves with their neighbors on certain measures and imitate and follow those who are superior to others), and imitate (taking the perspective of other individuals which actually means not to blindly imitate a behavior but rather to realize its purpose and execute the behavior only when it is appropriate). PSO, as it was originally proposed by Kennedy and Eberhart was about a swarm of particles each representing a potential solution, flying iteratively through the problem space in search of the best fitted solution. Like genetic algorithm (GA), the system is initialized with a population of random solutions (particles). However, unlike GA, each particle is also assigned with a random velocity which guides the particle through its navigation in the problem space. The optimization takes place by changing the velocity (accelerating) of each particle towards its personal best position (pBest) and the global best position (gBest) of the swarm. Particle swarm implementations usually follow one of the two sociometric principles which are known as Global Best (gBest) and Local Best (lBest) PSOs. These two types are discussed briefly in the following sections.

In global best PSO, each particle conceptually is connected to every other particle and it could be said that the neighborhood of each particle is the entire swarm. The effect of using this topology is that each particle is affected by any member of the entire swarm population which performs best.

In local best PSO, a neighborhood is created for each individual (including the individual itself) and its k nearest neighbor. A simple example of this topology would be with k=2 (ring topology) in which particle i is influenced by the best particle among particles i−1, i, i+1. In other words, each particle is affected based on the local knowledge of the environment.

Since we want to adjust individual's disposition towards the success of both the individual and the community, the presence of pBest and gBest is necessary in the update velocity equation. From sociological point of view, pBest resembles autobiographical memory and the velocity adjustment associated with it is called "simple nostalgia", in which individual seeks to return to the best place which they have already experienced in the past. Alternatively, gBest is similar to publicized knowledge or group norm which individual seeks to imitate. In the literature, the group norm is also referred to as "social knowledge." The velocity update takes place using the following equation:

$$v_{id}^{t+1} = v_{id}^t + c_1 r_1 (P_{best,i} - x_{id}^t) + c_2 r_2 (G_{best} - x_{id}^t) \quad \text{(Equation 1)}$$

where:

$v_{id}^t$ is the velocity vector of particle i in dimension d at time t;

$x_{id}^t$ is the position of particle i in dimension d at time t;

$P_{best,i}$ is the personal best position of particle i found so far;

$G_{best}$ is the best fitted particle found so far by the swarm;

$C_1$ is acceleration constant which determines nostalgia component contribution;

$C_2$ is acceleration constant which determines social component contribution; and $r_1$ and $r_2$ are random numbers from uniform distribution between 0.0 and 1.0.

For local best PSO version, we just use $L_{best}$ instead of $G_{best}$ in the social component of equation 1.

In each iteration, after updating particle's velocity, each particle will adjust its position based on its previous location in the problem space and the newly updated velocity using the following equation:

$$x_i^{t+1} = x_i^t + v_i^{t+1} \quad \text{(Equation 2)}$$

where:

$x_i^{t+1}$ denotes the new position vector of particle i (at time t+1);

$x_i^t$ is previous position of particle i (at time t); and $v_i^{t+1}$ denotes the newly updated velocity of particle i (at time t+1).

Here the algorithm to implement the global version of PSO is described:

1: Initialize a population of particles with random velocities and positions on d dimension in the problem space.

2: while maxIteration reached or good enough fitness achieved do

3: Evaluate the fitness function for each particle.

4: Compare particle's fitness with particle's pBest. If current value is better than pBest, set pBest to the current particle in d-dimensional space.

5: Compare fitness evaluation with the population's overall previous best. If current value is better than gBest, set gBest to the current particle.

6: Change the velocity and position of the particle according to equation (1) and (2.)

7: end while

8: The gBest particle is the sufficiently good fitness achieved through the optimization process.

The number of particles in the swarm defines the initial diversity of it. While having a large number of particles helps to cover more sections of the problem space, it also raises the computational complexity and degrades PSO to a random search. Empirical studies have shown that a small swarm size with the initial population between 10 to 30 particles is enough to find good solutions. Although it should be noted that the swarm size is problem dependant and roughness or smoothness of the search space actually defines the number of particles in the swarm.

The size of the neighbourhood defines how much particles interact with each other. PSOs with large neighbourhood converge faster, however, neighbourhoods with smaller sizes are less likely to fall into local optima. According to literature, it has been proposed an approach in which by starting with a small neighbourhood size and increasing the perimeter of the neighbourhood iteratively, an initial high diversity with faster convergence is ensured.

In equation (1), the acceleration coefficients, $C_1$ and $C_2$, control the influence of nostalgia and social components of the particle's velocity vector. Usually the values of $C_1$ and $C_2$ are found empirically, lower values for them results in smooth particle flight while high values cause more acceleration and sudden movements towards other components. It is reasonable to set both $C_1$ and $C_2$ to 2.0, in order to make the search cover all regions around the components of velocity equation. Also in many studies the value of 1.49445 is used to ensure convergence using a constriction factor.

One problem which is associated with PSO is its high convergence speed. Although, high convergence rate speeds up the optimization process, it might result in a not very thorough search which makes many areas of problem space to remain unexplored. There are two characteristics which define how well an optimization algorithm searches the problem space; those are referred to as exploration and exploitation. The ability to search different regions of the problem space, seeking better optima, is called exploration and the ability to focus on a promising area to refine a candidate solution is called exploitation. To provide a good optimization algorithm there should be a well-defined trade-off between these two objectives. Different variations of PSO which help to balance this trade-off are brought in below.

Each particle flies through the problem space using its velocity vector. PSO algorithm adjusts velocity in a way that the particle could move into every dimension of the problem space. The velocity equation which discussed before (Eq. 1)

has a tendency to explode when oscillations become wider and wider. One method that is usually employed to damp the velocity is to prevent it from exceeding on each dimension d for individual i:

if $v_{id} > V_{max}$ then $v_{id} = V_{max}$ else if $V_{id} < -V_{max}$ then $v_{id} = -V_{max}$      Equation 3

$V_{max}$ is usually selected empirically based on the problem characteristics.

A version of PSO that used an inertia weight as a mechanism to enable controlling the exploration and exploitation of the swarm as well as helping to eliminate the need of velocity clamping has been used. The inertia weight, $\omega$, controls how much of the previous memory of flight direction controls the new velocity of particle which for gBest PSO it changes the velocity update equation (1) into:

$$v_{id}^{t+1} = \omega v_{id}^t + c_1 r_1 (P_{best,i} - x_{id}^t) + c_2 r_2 (G_{best} - x_{id}^t) \quad \text{Equation 4}$$

Setting $\omega < 1$ will cause particle's velocity to decelerate over time. Larger values for $\omega$ help the particle to explore the problem space more easily and improve diversity of solutions, while smaller values for $\omega$ help the algorithm to search local neighbourhoods more thoroughly. However, too small values disable the swarm exploration ability.

A similar approach to inertia weight has been used in order to determine exploration-exploitation trade-off, to exclude the inertia weight $\omega$, and to get rid of velocity clamping. In this approach velocities are limited to a constant $\chi$, which is referred to as the constriction coefficient. The velocity update equation (1) of particle i for dimension j changes into:

$$v_{id}^{t+1} = \chi(v_{id}^t + \phi_1(P_{best,i} - x_{id}^t) + \phi_2(G_{best} - x_{id}^t)) \quad \text{Equation 5}$$

where:

$$\chi = \frac{2k}{|2 - \phi - \sqrt{\phi(\phi - 4)}|} \quad \text{Equation 6}$$

with
$\phi = \phi_1 + \phi_2$, ($\phi \geq 4$, $k \in [0,1]$);
$\phi_1 = c_1 r_1$;
$\phi_2 = c_2 r_2$.

By satisfying the constraints $\phi \geq 4$ and $k \in [0, 1]$, the swarm is guaranteed to converge to a stable point. Parameter k controls the ability of swarm to explore or exploit. For values of k near zero the swarm converges faster, while considering k near 1 will cause a slower convergence with higher exploration degree. Usually k is considered as a constant during the optimization, however some researchers used k with a value near to one at the initial search phases to provide initial high exploration and later decreased it to near zero to provide more local exploitation in later phases.

As discussed above, in particle swarm optimization, usually each particle represents a potential solution for the problem at hand. These solutions try to enhance themselves by employing their own local knowledge of their best performance and the available neighbourhood knowledge of other topologically close particles. Since we want to find the best arrangement of cameras in a closed polygon with regard to different constraints, the most important thing that should be identified is how to represent a solution by different particles. Afterwards, the boundary criteria of a valid solution should be defined.

Figures 9, 10:
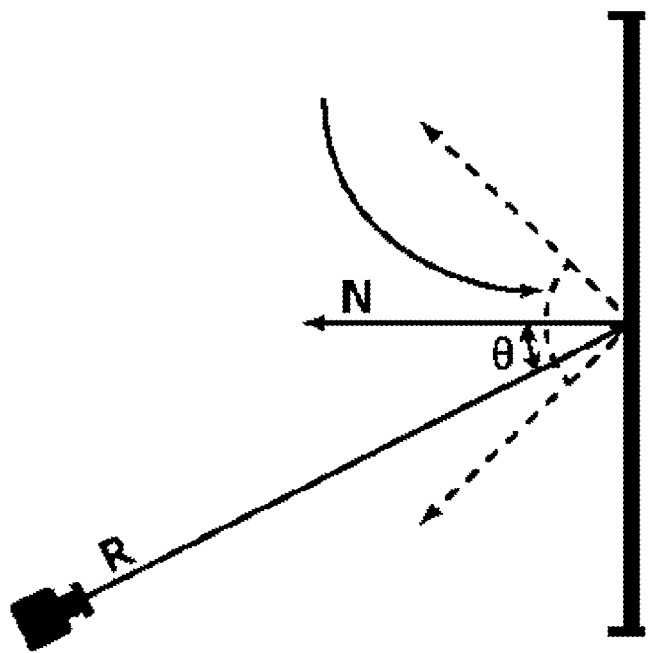
FIG. 9 describes PSO particle encoding.
FIG. 10 describes required view angle of incidence for a camera monitoring a monitoring area.

We have used a fixed length particle encoding to represent the cameras arrangement. Hence, in-order to arrange n cameras in a given layout, each particle of the swarm should consist of n genes in which each gene contains the orientation and pose of one of the cameras as well as its model information. The particle encoding is illustrated in FIG. 9. Each gene is associated with a camera model which contains additional information about the specific model's intrinsic parameters. These parameters will be used further in calculation of camera cone, visibility, and the partial coverage of each camera.

In the initial phase of PSO algorithm, $N_c$ number of particles would be generated and randomly initialized. To prevent unnecessary computational cost, we only generate feasible (valid) solutions. In order to verify validity of the solutions, we first force the initialization process to place the cameras inside the main outer polygon excluding inner polygons (holes). In this way, we ensure that no camera is wasted. This process, in computer graphics, is called Hit-Testing. For hit-testing a simple and efficient algorithm were used in which a semi-infinite horizontal ray (setting y coordinate fixed and increasing x coordinate) is emitted from the test point, and by counting how many edges it crosses and changing between the ray inside and outside at each crossing, it would be determined if the point is inside the polygon or not. Below an outline of how these steps are performed are shown:

---

Hit testing:

---

```
public bool HitTest(Polygon poly, double x, double y)
{
    bool odd = false;
    PointList Points = poly.vertices;
    for (int i = 0, j = Points.Count − 1; i <= Points.Count − 1; j = i++)
    {
        if (((Points[i].Y > y) !=(Points[j].Y > y)) &&
            (x < ((Points[j].X − Points[i].X) * (y − Points[i].Y / ←
                Points[j].Y − Points[i].Y + Points[i].X)))
            odd = !odd;
    }
    return odd;
}
```

For polygons with holes, the procedure above should be used against all the polygon holes to ensure that a point resides correctly inside the closed polygon and will not be placed in one of the holes. In summary, each particle's gene, would be initialized according to the constraints mentioned in equation (7) below. Camera models are sequentially assigned to genes with regard to the user requirements. Tilt angle ($\beta$) is restricted to $\pm \phi_{v/2}$ ($\phi_v$ is camera's vertical FoV), because in practical situations cameras do not tilt too much around horizontal line, hence to avoid computational costs we limit the tilt angle. Obviously, pan angle ($\theta$) can be set to any arbitrary angle, since we want to try all angles of the scene.

$$M_i \leftarrow \text{User specified camera model } i \quad \text{Equation 7}$$

$$\beta \leftarrow Rand\left(-\frac{\phi_v}{2}, +\frac{\phi_v}{2}\right)$$

$$\phi \leftarrow Rand\ (0, 2\pi).$$

(x, y) ← A random location inside polygon $P_e$ (using Hit testing)

Particle initialization would be completed by assigning each particle a random velocity vector which determines particle's initial tendency to fly over the scene. To be able to initialize velocity vectors, first we need to set the upper and lower bound limits of each velocity. We used the following limits based on our empirical observations:

$$\text{step} \leftarrow 20$$
$$V_{x_{max}} = \frac{\tau_{width}}{\text{step}}, V_{x_{max}} = \frac{\tau_{height}}{\text{step}}$$
$$V_{x_{min}} = -\frac{\tau_{width}}{\text{step}}, V_{x_{min}} = -\frac{\tau_{height}}{\text{step}}$$
$$V_{\beta_{max}} = 15, V_{\phi_{max}} = 5$$
$$V_{\beta_{min}} = -15, V_{\phi_{min}} = -5$$

Equation 8 where $V_x$, $V_y$, $V_\beta$, and $V_\phi$ respectively represent velocity vectors of x, y, pan, and tilt of the gene. And $\tau$ represents the bounding box (smallest enclosing box) around the outer polygon which can be simply calculated by finding maximum and minimum (x, y) coordinates of the polygon's vertices. Finally, the acceleration vectors of particle's genes could be calculated using the following equations:

$$V_x = \text{rand}*(V_{x_{max}} - V_{x_{min}}) + V_{x_{min}}$$
$$V_y = \text{rand}*(V_{y_{max}} - V_{y_{min}}) + V_{y_{min}}$$
$$V_\beta = \text{rand}*(V_{\beta_{max}} - V_{\beta_{min}}) + V\beta_{x_{min}}$$
$$V_\phi = \text{rand}*(V_{\phi_{max}} - V_{\phi_{min}}) + V_{\phi_{min}}$$

Equation 9

The main idea in updating particle's velocities lies behind how each particle can learn from a better particle. In our method, the learning process happens through improving the particle to be similar to the better performing particle, and we do this by making similar genes (genes with the same type of camera) progressively converge together. This means that each gene's velocity should be coerced toward the better performing gene. We do that by aiming velocities in each dimension (location, pan, and tilt) to fill the gap between these two genes.

$$V_x = \omega V_x + \frac{c_1 r_1 (pBest_x - x) + c_2 r_2 (lBest_x - x)}{\zeta}$$
$$V_y = \omega V_y + \frac{c_1 r_1 (pBest_y - y) + c_2 r_2 (lBest_y - y)}{\zeta}$$
$$V_\beta = \omega V_\beta + \frac{c_1 r_1 (pBest_\beta - \beta) + c_2 r_2 (lBest_\beta - \beta)}{\zeta}$$
$$V_\theta = \omega V_\theta + \frac{c_1 r_1 (pBest_\theta - \theta) + c_2 r_2 (lBest_\theta - \theta)}{\zeta}$$

where:
pBest is the best performance of the gene until now (personal best);
lBest is the best performing particle's gene in the neighbourhood until now (local best);
$\omega$=Inertia coefficient set to 0.975;
$c_1$=Nostalgia coefficient set to 2.01;
$c_2$=Social coefficient set to 2.01;
$\zeta = c_1 r_1 + c_2 r_2$;
$r_1, r_2$=random numbers between 0 and 1.
As described above, after calculating the new velocities and in order to prevent wide oscillation effect, it is needed to clamp velocities with defined boundary values. Using variables specified in equations (8), we have limited velocities as follows:

$$V_x = \begin{cases} V_{x_{max}} & \text{if } V_x > V_{x_{max}} \\ V_{x_{min}} & \text{if } V_x < V_{x_{min}} \end{cases}$$
$$V_y = \begin{cases} V_{y_{max}} & \text{if } V_y > V_{y_{max}} \\ V_{y_{min}} & \text{if } V_y < V_{y_{min}} \end{cases}$$
$$V_\beta = \begin{cases} V_{\beta_{max}} & \text{if } V_\beta > V_{\beta_{max}} \\ V_{\beta x_{min}} & \text{if } V_\beta < V_{\beta_{min}} \end{cases}$$
$$V_\theta = \begin{cases} V_{\theta_{max}} & \text{if } V_\theta > V_{\theta_{max}} \\ V_{\theta_{min}} & \text{if } V_\theta < V_{\theta_{min}} \end{cases}$$

Coverage for each camera is computed by calculating the geometrical intersection of the visibility polygon for a point in a given scene and the camera FoV cone. The resulting polygon will give us information about which points are visible through certain pose and orientation of a given camera in the desired polygonal floor plan. We also need to calculate area of the visible field of view for each camera. This computed area of the combined intersected polygons will be used later for optimization purpose. In order to calculate the area of a polygon, we can simply add up the areas that lie between each line segment and x-axis.

Fitness function for each particle is calculated based on the area covered in each RoI and the total coverage of the floor plan. Different RoI types contribute differently to the fitness of a particle. Hence, we need to calculate the coverage for each permutation of cameras and RoIs. For instance, if we have three cameras and two RoIs, we need to perform 3×2 permutation of coverage calculation to evaluate overall fitness of the particle. Since the problem definition requires maximizing the coverage of certain RoIs and minimizing some others, total coverage is calculated by summing up all the returned calculated fitness values. One important aspect which should be considered when calculating coverage for different RoIs is that we need to combine all the covered regions together to discard the effect of overlapping fields of view. This is done through combining all the coverage geometries that contribute to each RoI and at the end applying RoI's specific constraints. After calculating RoI's specific fitness value, the total fitness is calculated by multiplying average of these values by the total area of the scene and adding raw total coverage to it. This procedure is described in the following algorithm:

| Update Fitness: |
| --- |
| for each RoI in model.RoIs do     for each gene in particle.genes do         roiCoverge ← Calculate gene coverage for RoI regarding constraints         totalRoICoverage totalRoICoverage + roiCoverage     end for     fitness ← fitness + CalculateRoISpecificFitness(RoI, totalRoIcoverage) end for fitness ← (fitness / RoICount)*poly.Area + totalVCoverage |

In this way we ensure that maximizing RoI coverage is the first priority and maximizing total coverage is of the second priority.

For simple monitoring areas, i.e. with no required view angle of incidence for more than one camera monitoring the monitoring area (as described in FIGS. 1-3 but not in FIG. 4), the most important requirement that should be satisfied is the resolution threshold which should be fulfilled by at least one camera. In order to do so, we should recalculate FoV cone of each gene (camera) to find out the visible area with the required resolution threshold, then ordinary cone calculation which was described in previous section will be used to find the geometrical visibility. Finally, area of the geometry would be calculated and added to the fitness value.

Non monitoring areas (as shown in FIG. 3) should not be visible to any camera. Hence the calculation of fitness for them is like simple monitoring areas except that the final calculated area should be subtracted from the fitness value. This would act as a penalty value to the fitness function and hence coercing the particles to avoid camera arrangements which cover these regions.

For monitoring areas with more than one required view angle of incidence (as described in FIG. 4), what is also important is the angle that each camera views the region through it. To calculate the fitness value for these kinds of areas, only those cameras which the angle between them (vector R in FIG. 10) and the normal vector (vector N in FIG. 10) of the area is not more than the required view angle of incidence should contribute to the fitness calculation.

This angle can be calculated using the dot product of vectors R and N as follows:

$$\theta = \arccos\left(\frac{R \cdot N}{|R||N|}\right)$$

where:

θ is the angle that camera sees the line through it;

R is the ray emanated from camera to the center of the RoI; and

N is the normal vector through the center of the RoI and perpendicular to RoI line.

After velocities were updated, particles should actually fly. Particle flight is performed by moving each gene with regard to its associated velocity which affects the next position, pan and tilt angles of that gene. One aspect to consider is that this movement of the particle should not lead to an out of bound movement. In case it happened, we need to correct the move. For that, we update the velocity vector in two major ways: first, dividing its value by two (it could be in x or y direction or both); second, if the mentioned corrective method was not successful, we reflect the velocity vector (again in x or y direction or both) to create a valid move. In both cases, this change of velocity would not be permanent and will have a one-time-only effect on the movement so that it could enable the gene to escape from an invalid move. For tilt and pan angles, we do not apply such restrictions.

We considered two particles to be in a same neighbourhood if they were located in a reasonably close arrangement. We characterized closeness arrangement as the physical distance between each similar gene in two different particles, by which we mean that an average distance between each corresponding gene should be less than a specific range. This range is defined as the diameter of the outer polygon's bounding box divided by a certain step (20 in our case). We did not include pan and tilt angles in closeness measurement because we want to let the physically close genes but varied in pan and tilt angles to form a neighbourhood in which they could benefit from a local best which was constructed from a set of genes with a broad range of orientation choices while still having reasonably similar arrangement.

The selection of this neighbourhood is shown below:

Neigbourhood Selection:

```
for each p₁ in swarm.Particles do
    if p₁ is unclustered then
        p₁.cluster ← Create new cluster
        for each p₂ in swarm.Particles do
            if p₁ ≠ p₂ and p₂ is unclustered then
                if p₂.IsInDistanceOf(p₁,BoundingBox_Diamater / 20)
                then
                    p₂.cluster ← p₁.cluster
                end if
            end if
        end for
    end if
end for
```

We start by creating a cluster of one particle and continue by adding the reasonably close particles to it. This process will be repeated for all unclustered particles in the swarm.

The person skilled in the art realizes that the present invention by no means is limited to the embodiments described above. On the contrary, many modifications and variations are possible within the scope of the appended claims. For example, the camera features may comprise more features, for example the sensor size of the camera, which may be altered in the iteration of the fitness function. The sensor size is one of the parameters which determine field of view of a camera and it also affects the resolution of the camera. It may further be noted that while iterating the fitness function, any number of the above described alterable features (for example position, orientation, number of cameras, zoom level of a camera etc.) may be changes in each iteration for the monitoring cameras. The above described is just exemplifying some of the possible alteration schemes.

What is claimed is:

1. A method for selecting position and orientation for one or more monitoring cameras in an area, the area comprising at least a monitoring area and a non-monitoring area, the method comprising the steps of:

receiving, by a processor, data regarding the area;

modeling, by the processor, a virtual area with use of the data;

evaluating, by the processor, iterations of a fitness function, the fitness function comprising position and orientation of the one or more monitoring cameras within the virtual area for calculating a simulated coverage area for the one or more monitoring cameras and for calculating a simulated view angle of incidence for the monitoring area; and selecting, by the processor, a fitted solution to the fitness function, the fitted solution comprising the position and orientation of the one or more monitoring cameras, wherein the selecting is based on the calculated simulated coverage area for the one or more monitoring cameras, the calculated simulated view angle of incidence for the monitoring area, and a required view angle of incidence for the monitoring area, wherein at least one of the position and orientation of at least one of the one or more monitoring cameras within the virtual area are altered in each iteration and wherein iterations of the fitness function are evaluated until the fitted solution comprises a simulated coverage area completely covering the monitoring area and not covering the non-monitoring area, and the fitted solution fulfilling the required view angle of incidence for the monitoring area, wherein alterations in each iteration are performed by a particle swarm optimization (PSO) algorithm, wherein the plurality of cameras are n in number, wherein an initial phase of the PSO algorithm comprises generation of n particles, each particle corresponding to a specific one of the plurality of cameras, and wherein an initial positioning of each of the n particles comprises employing a Hit-testing algorithm to position each particle inside a main outer polygon of the virtual area excluding any inner polygons representing a hole in the virtual area.

2. The method according to claim 1, wherein the step of selecting a fitted solution is further based on a required resolution for an image captured by at least one of the one or more monitoring cameras monitoring the monitoring area.

3. The method according to claim 1, wherein the area further comprises a blank area, and wherein the step of selecting a fitted solution is further based on a percentage of the blank area being monitored.

4. The method according to claim 1, wherein the fitness function comprises a number of monitoring cameras and wherein the fitted solution further comprises the number of monitoring cameras.

5. The method according to claim 4, wherein at least one of the number of monitoring cameras within the virtual area and the position and the orientation of at least one of the one or more monitoring cameras within the virtual area, are altered in each iteration.

6. The method according to claim 1, wherein each of the at least one monitoring cameras comprises camera features, the camera features comprising at least one of a field of view and a zoom level, and wherein the fitted solution comprises the camera features of the at least one monitoring cameras.

7. The method according to claim 6, wherein at least one of the camera features of the at least one monitoring camera within the virtual area and the position and the orientation of at least one of the one or more monitoring cameras within the virtual area, are altered in each iteration.

8. The method according to claim 1, wherein the fitness function further comprises at least two monitoring cameras and wherein the step of selecting a fitted solution is further based on a required view angle of incidence for the monitoring area for each of the at least two monitoring cameras.

9. The method according to claim 1, wherein the simulated coverage area is calculated using an active edge algorithm.

10. A computer-readable recording medium having recorded thereon a program for implementing the method according to claim 1 when executed on a device having processing capabilities.

11. A system for selecting position and orientation for one or more monitoring cameras in an area, the area comprising at least a monitoring area and a non-monitoring area, the system comprising:
one or more computer processors configured to:
receive data regarding the area;
model a polygonal representation of a virtual area with use of the data;
evaluate iterations of a fitness function for calculating a fitted solution, the fitness function comprising a position and orientation of the one or more monitoring cameras within the virtual area for calculating a simulated coverage area for the one or more monitoring cameras and for calculating a simulated view angle of incidence for the monitoring area; and
select a fitted solution to the fitness function, the fitted solution comprising the position and orientation of the one or more monitoring cameras, wherein the selection is based on the calculated simulated coverage area for the one or more monitoring cameras, the calculated simulated view angle of incidence for the monitoring area, and a required view angle of incidence for the monitoring area, wherein at least one of the position and orientation of at least one of the one or more monitoring cameras within the virtual area are altered in each iteration and wherein iterations of the fitness function are evaluated until the fitted solution comprises a simulated coverage area completely covering the monitoring area and not covering the non-monitoring area, and the fitted solution fulfilling the required view angle of incidence for the monitoring area, wherein alterations in each iteration are performed by a particle swarm optimization (PSO) algorithm, wherein the plurality of cameras are n in number, wherein an initial phase of the PSO algorithm comprises generation of n particles, each particle corresponding to a specific one of the plurality of cameras, and wherein an initial positioning of each of the n particles comprises employing a Hit-testing algorithm to position each particle inside a main outer polygon of the virtual area excluding any inner polygons representing a hole in the virtual area.

12. The system according to claim 11, wherein selecting a fitted solution is further based on a required resolution for an image captured by at least one of the one or more monitoring cameras monitoring the monitoring area.

13. The system according to claim 11, wherein the area further comprises a blank area, and wherein selecting a fitted solution is further based on a percentage of the blank area being monitored.

14. The system according to claim 11, wherein the fitness function comprises a number of monitoring cameras and wherein the fitted solution further comprises the number of monitoring cameras.

15. The system according to claim 14, wherein at least one of the number of monitoring cameras within the virtual area and the position and the orientation of at least one of the one or more monitoring cameras within the virtual area, are altered in each iteration.

16. The system according to claim 11, wherein each of the at least one monitoring cameras comprises camera features, the camera features comprising at least one of a field of view and a zoom level, and wherein the fitted solution comprises the camera features of the at least one monitoring cameras.

17. The system according to claim 16, wherein at least one of the camera features of the at least one monitoring camera within the virtual area and the position and the orientation of at least one of the one or more monitoring cameras within the virtual area, are altered in each iteration.

18. The system according to claim 11, wherein the fitness function further comprises at least two monitoring cameras and wherein the step of selecting a fitted solution is further based on a required view angle of incidence for the monitoring area for each of the at least two monitoring cameras.

19. The system according to claim 11, wherein the simulated coverage area is calculated using an active edge algorithm.

* * * * *